(12) United States Patent
Yoshimoto et al.

(10) Patent No.: US 8,787,075 B2
(45) Date of Patent: Jul. 22, 2014

(54) LOW-VOLTAGE SEMICONDUCTOR MEMORY

(75) Inventors: Masahiko Yoshimoto, Hyogo (JP); Hiroshi Kawaguchi, Hyogo (JP); Yohei Nakata, Hyogo (JP); Shunsuke Okumura, Hyogo (JP)

(73) Assignee: The New Industry Research Organization, Hyogo (JP)

( * ) Notice: Subject to any disclaimer, the term of this patent is extended or adjusted under 35 U.S.C. 154(b) by 32 days.

(21) Appl. No.: 13/816,718

(22) PCT Filed: Aug. 14, 2011

(86) PCT No.: PCT/JP2011/004580
§ 371 (c)(1),
(2), (4) Date: Apr. 17, 2013

(87) PCT Pub. No.: WO2012/023277
PCT Pub. Date: Feb. 23, 2012

(65) Prior Publication Data
US 2013/0223137 A1    Aug. 29, 2013

(30) Foreign Application Priority Data
Aug. 14, 2010    (JP) .................... 2010-181481

(51) Int. Cl.
| G11C 11/00 | (2006.01) |
| G11C 11/412 | (2006.01) |
| G11C 11/417 | (2006.01) |
| G11C 8/12 | (2006.01) |
| G11C 15/04 | (2006.01) |
| G11C 11/413 | (2006.01) |
| G11C 8/14 | (2006.01) |
| G11C 15/00 | (2006.01) |

(52) U.S. Cl.
CPC ............ *G11C 11/417* (2013.01); *G11C 11/412* (2013.01); *G11C 8/12* (2013.01); *G11C 2211/5641* (2013.01); *G11C 15/04* (2013.01); *G11C 15/00* (2013.01); *G11C 11/413* (2013.01); *G11C 8/14* (2013.01)
USPC .......................................... 365/156; 365/154

(58) Field of Classification Search
USPC ........................................................... 365/156
See application file for complete search history.

(56) References Cited

U.S. PATENT DOCUMENTS

| 6,781,904 B2 | 8/2004 | Lee et al. |
| 8,238,140 B2 * | 8/2012 | Yoshimoto et al. ........... 365/156 |
| 2007/0011406 A1 | 1/2007 | Takase et al. |

FOREIGN PATENT DOCUMENTS

| JP | 2007-018514 A | 1/2007 |
| JP | 2009123306 A | 6/2009 |
| JP | 2010157297 A | 7/2010 |
| WO | 2009/088020 A2 | 7/2009 |

OTHER PUBLICATIONS

"International Search Report", Mailed Date: Dec. 6, 2011, Application No. PCT/JP2011/004580, 2 Pages.

* cited by examiner

*Primary Examiner* — Son Mai
(74) *Attorney, Agent, or Firm* — Ogilvie Law Firm

(57) ABSTRACT

Provided is memory which is capable of dynamically changing memory cell bit reliability and of switching the operating mode so as to accommodate process variations, thereby reducing the operating voltage. The memory is provided with a mode control line selection circuit for dividing mode control lines in to word units and using control line selection signals and global control signals to control the mode control lines divided into word units, and a word line selection circuit for dividing the word lines that control the conduction of switching unit into word units and using word line selection signals and global word signals to control the word lines divided into word units. The mode control line switching circuit is used to switch between a 1 bit/1 cell mode and a 1 bit/n cell mode in word units.

15 Claims, 10 Drawing Sheets

LOW-VOLTAGE SEMICONDUCTOR MEMORY

TECHNICAL FIELD

The present invention relates to a low-voltage semiconductor memory architecture and a method of controlling the same.

BACKGROUND ART

With recent semiconductor memories such as SRAMs (Static Random. Access Memory), advanced CMOS process technologies for SoC applications have led to a reduction in the processing dimensions (scaling sizes) of integrated circuits, which in turn has led to higher chip density, lower chip cost, and increased memory capacity.

Such a reduction in the scaling size causes increased variation in the threshold voltage of transistors including SRAMs and other memory cells, reduced read/write noise margins from/to memory cells, destabilized memory cell operation, and increased bit error rate (BER; Bit Error Rate).

FIG. 1 is a graph relating the process technology node to the operating voltage of CMOS transistors in CMOS transistors. As the scaling size decreases, that is, miniaturization of the process technology node advances, the applied voltage $V_{DD}$ decreases. However, as shown in the dotted frame in the graph, the process technology node advancing 65 (nm) or smaller allows a voltage drop limit due to process variation. This is for the reason that as miniaturization of the process technology node advances, systematic factors such as manufacturing processes and memory cell locations and/or process variations in operating environments such as temperature environments and soft errors caused by cosmic rays increase the variation in the threshold value and thereby the reliability of CMOS transistors is reduced, resulting in an increase in the minimum operating voltage $V_{min}$ of CMOS transistors.

It is therefore a very important issue for advanced microVLSIs to operate at a low voltage. For lower power consumption and higher reliability, there is a need to stabilize the operation of memory cells including CMOS transistors.

Under such circumstances described above, the inventors had already proposed a novel semiconductor memory in which the bit reliability of memory cells can be varied dynamically according to applications and memory states to secure operation stability and achieve lower power consumption and higher reliability. The semiconductor memory provides dynamic switching between a mode in which one bit is allocated to one memory cell (1-bit/1-cell mode: hereinafter referred to as "normal mode") and a mode in which one bit is allocated to n (where n is two or more) coupled memory cells (1-bit/n-cell mode: hereinafter referred to as "high-reliability mode"). Switching from the normal mode to the high-reliability mode enhances the operation stability of one bit, increases the cell current during read operations (for faster readout), and allows bit errors to be self-corrected (see Patent Document 1, for example).

FIG. 2 shows an embodiment of the proposed semiconductor memory, including memory cells each in turn including a pair of cross-couple connected inverters with the respective outputs connected to paths leading to a pair of respective bit lines disposed in correspondence to a column of the memory cells, a pair of switch units disposed between the bit lines and the outputs of the inverters, and a single word line for controlling the conduction of the switch units. In the thus arranged semiconductor memory, a pair of P-type MOS transistors and a single mode control line for controlling the P-type MOS transistors to be in conduction are further added between data holding nodes of two adjacent memory cells.

The circuit behavior of the memory cells shown in FIG. 2 will now be described briefly.

The memory cell (MC01) shown in FIG. 2 forms a latch circuit including a P-type MOS transistor (M00) and an N-type MOS transistor (M02) connected in series between a power supply potential VVDDA and a ground potential VGNDA and a P-type MOS transistor (M01) and an N-type MOS transistor (M03) connected in series between the power supply potential VVDDA and the ground potential VGNDA. The memory cell (MC01) itself employs a common 6-transistor configuration.

Similarly, the memory cell (MC10) forms a latch circuit including a P-type MOS transistor (M10) and an N-type MOS transistor (M12) connected in series between a power supply potential VVDDB and a ground potential VGNDB and a P-type MOS transistor (M11) and an N-type MOS transistor (M13) connected in series between the power supply potential VVDDB and the ground potential VGNDB. The memory cell (MC10) itself also employs a common 6-transistor configuration.

In the memory cell (MC01), the gate terminals of the P-type MOS transistor (M00) and the N-type MOS transistor (M02) are both connected to a node (N01) of the P-type MOS transistor (M01) and the N-type MOS transistor (M03). Also, the gate terminals of the P-type MOS transistor (M01) and the N-type MOS transistor (M03) are both connected to a node (N00) of the P-type MOS transistor (M00) and the N-type MOS transistor (M02). The transistors M00 to M03 are thus cross-couple connected, and the P-type MOS transistors (M00 and M01) operate as load transistors, while the N-type MOS transistors (M02 and M03) operate as drive transistors. The same applies to the memory cell (MC10).

The memory cell (MC01) also includes N-type MOS transistors (M04 and M05) as switch units connected, respectively, between complementary bit lines (BL and /BL) and the nodes (N00 and N01). The gate terminals of the N-type MOS transistors (M04 and M05) are both connected to a common word line (WLA), and gate potentials of the N-type MOS transistors (M04 and M05) are controlled through the word line (WLA). That is, in the memory cell (MC01), the P-type MOS transistors (M00 and M01) operate as load transistors, while the N-type MOS transistors (M02 and M03) operate as drive transistors, and the N-type MOS transistors (M04 and M05) operate as switch units.

The memory cell (MC10) also includes N-type MOS transistors (M14 and M15) as switch units connected, respectively, between the complementary bit lines (BL and /BL) and the nodes (N10 and N11). The gate terminals of the N-type MOS transistors (M14 and M15) are both connected to the common word line (WLA), and gate potentials of the N-type MOS transistors (M14 and M15) are controlled through the word line (WLA).

A pair of P-type MOS transistors (M20 and M21) are provided as mode control switch units between the data holding nodes (between N00 and N10 and between N01 and N11) of the memory cells (MC01 and MC10), and a single mode control line (/CTRL) for controlling the conduction of the P-type MOS transistors (M20 and M21) is provided.

In the thus arranged memory cells with such a circuit configuration, it is possible, using the mode control line (/CTRL), to separately use storing 1-bit data in the memory cell (MC01) and storing 1-bit data in the two memory cells (MC01 and MC10). The memory cells with such a circuit configuration have two states: a mode (normal mode) in which one bit is allocated to one memory cell and a mode (high-reliability mode) in which one bit is allocated to two coupled memory cells, whereby the bit reliability of the memory cells can be varied dynamically according to applications and memory states to secure operation stability and achieve lower power consumption and higher reliability.

As shown in FIG. 3, switching between the normal mode in which one bit is allocated to one memory cell and the high-reliability mode in which one bit is allocated to two coupled memory cells has conventionally been controlled at the level of memory cell blocks. Uniform switching control of the operating modes for each memory block, however, suffers from a problem of inhibiting achievement of lower operating voltage due to process variation.

On the other hand, known low-voltage cache memories and the like have eliminated factors inhibiting achievement of lower operating voltage of memory cells due to process variation, that is, have a created failure word map and use memories excluding failure words to achieve lower operating voltage.

As shown in FIG. 4, this is arranged such that four failure words (having a smaller operating margin) are preliminarily identified in one physical cache line (eight words form one cache line in FIG. 4), a failure word map (e.g. 01010011) is created, and a logic circuit is used to prepare one-half logic cache line using four failure-free words (having a larger operating margin). Similarly, four failure words are created in another physical cache line and a logic circuit is used to prepare one-half logic cache line using four failure-free words (having a larger operating margin).

Next, as shown in FIG. 5, the two one-half logic cache lines are joined to prepare one logic cache line. All the words forming this one logic cache line have a larger operating margin and thereby making it operable at a low voltage.

However, such a technique of joining two one-half logic cache lines to prepare one logic cache line inevitably cuts the cache memory capacity and the association in half.
[Patent Document 1] WO2009/088020

OUTLINE OF THE INVENTION

Problems to be Solved by the Invention

As mentioned above, uniform switching control of the two operating modes, normal mode and high-reliability mode, for each memory block in the proposed semiconductor memory suffers from a problem of inhibiting achievement of lower operating voltage due to process variation.

Under the circumstances described above, as an improvement to the proposed semiconductor memory in which the bit reliability of memory cells can be varied dynamically, an object of the present invention is to provide a semiconductor memory in which switching between two operating modes is allowed on a word unit to address process variation and thereby making it possible to achieve a much lower memory operating voltage.

Means to Solve the Objects

In order to achieve the above-described object, a first aspect of the present invention provides a semiconductor memory including memory cells each in turn including a pair of cross-couple connected inverters with the respective outputs connected to paths leading to a pair of respective bit lines disposed in correspondence to a column of the memory cells, a pair of switch units provided between the bit lines and the outputs of the inverters, and a single word line for controlling the conduction of the switch units, and a mode control switch unit and a single mode control line for controlling the conduction of the mode control switch unit provided between data holding nodes of adjacent memory cells, the semiconductor memory providing dynamic switching, using the mode control line, between a mode in which one bit is allocated to one memory cell (1-bit/1-cell mode) and a mode in which one bit is allocated to n (where n is two or more) coupled memory cells (1-bit/n-cell mode), the semiconductor memory further including:

(1-1) a mode control line selector for dividing the mode control line into word units and selecting among the divided respective word-unit mode control lines; and (1-2) a word line selector for dividing the word line into word units for controlling the conduction of the switch unit and selecting upon data readout the word line of a memory cell with a word having a larger operating margin as a result of a word-unit memory cell comparison.

According to the arrangement above, switching between the 1-bit/1-cell mode and the 1-bit/n-cell mode is allowed on a word unit using the mode control line selector. In addition, the word line of a word-unit memory cell having the largest operating margin can be selected upon data readout, using the word line selector, among the coupled word-unit memory cells used in the 1-bit/n-cell mode.

In the conventionally proposed semiconductor memory, it has been desirable to perform switching between the 1-bit/1-cell mode and the 1-bit/n-cell mode on a memory block unit. This is in consideration of the design of peripheral circuitry (e.g. XY-decoder circuit, sense amplifier circuit). That is, since performing mode switching not on a block unit but on a row or column unit requires a complex control technique, the mode switching is to be performed on a block unit.

However, the inventors have repeated studies to eventually find that performing mode switching between the 1-bit/1-cell mode and the 1-bit/n-cell mode at the fine level of a word in the conventionally proposed semiconductor memory allows for addressing process variation described above, a factor reducing the reliability of memory cells including CMOS transistors, and thereby making the proposed semiconductor memory possible to operate at a much lower voltage.

That is, in the conventionally proposed semiconductor memory, uniform mode switching between the 1-bit/1-cell mode and the 1-bit/n-cell mode on a block unit would inhibit achievement of lower operating voltage due to process variation as miniaturization of the process technology node advances. On the other hand, performing mode switching between the 1-bit/1-cell mode and the 1-bit/n-cell mode on a word unit allows for addressing process variation while maintaining the functionality of the cache memory, achieving a significant reduction in the minimum operating voltage and an increase in the operating margin, compared to the conventional mode switching on a block unit.

The mode switching on a word unit here means, if 32 bits form one word, for example, switching the modes on a unit of 32 memory cells. For example, if eight words form one physical cache line in a cache memory, any of the words (i.e. not limited to one) are expected to have a smaller operating margin (likely to run a poor operation) as a result of process variation.

In this case, the words having a smaller operating margin (likely to run a poor operation) undergo mode switching to transit from the 1-bit/1-cell mode to the 1-bit/n-cell mode so as to have a larger operating margin (less likely to run a poor operation).

Ina specific memory array configuration to be described hereinafter in an embodiment, a mode control line selector as denoted by (1-1) above is used to divide the mode control line into word units and select among the respective divided word-unit mode control lines for word-unit mode switching between the 1-bit/1-cell mode and the 1-bit/n-cell mode. Specifically, the mode control line selector is controlled by a control line selection signal selectable in a matrix on a word unit and a global control signal.

Further, a word line selector as denoted by (1-2) is used to divide the word line into word units for controlling the conduction of the switch unit and select among the respective divided word-unit word lines. Specifically, the word line selector is arranged so as to be controlled by a word line selection signal selectable in a matrix on a word unit and a global word signal.

Here, an improvement to the conventionally proposed semiconductor memory is that the mode control line selector and the word line selector are provided additionally in the memory.

The mode control line selector is thus used to enable to perform switching between the 1-bit/1-cell mode and the 1-bit/n-cell mode on a word unit.

Also, the word line selector is thus used to select the word line of a word-unit memory cell having the largest operating margin, upon data readout, among the coupled word-unit memory cells used in the 1-bit/n-cell mode.

The word-unit memory cell having the largest operating margin among the word-unit memory cells here means that selected as having the largest operating margin (i.e. having a smaller bit error rate even at a low voltage) among the coupled word-unit memory cells used in the 1-bit/n-cell mode as a result of a test of measuring the bit error rate of each word-unit memory cell. The word line selector can assign the selected memory cell preferentially to the 1-bit/1-cell mode and makes it possible to transit to the 1-bit/n-cell mode so that the selected memory cell has a much larger operating margin, which minimizes the impact of process variation if eight words form one physical cache line, for example.

A second aspect of the present invention provides a semiconductor memory including memory cells each in turn including a pair of cross-couple connected inverters with the respective outputs connected to paths leading to a pair of respective bit lines disposed in correspondence to a column of the memory cells, a pair of switch units provided between the bit lines and the outputs of the inverters, and a single word line for controlling the conduction of the switch units, and a mode control switch unit and a single mode control line for controlling the conduction of the mode control switch unit provided between data holding nodes of adjacent memory cells, the semiconductor memory providing dynamic switching, using the mode control line, between a mode in which one bit is allocated to one memory cell (1-bit/1-cell mode) and a mode in which one bit is allocated to two coupled memory cells (1-bit/2-cell mode), the semiconductor memory further including:

(2-1) a mode control line selector for dividing the mode control line into word units and selecting among the respective divided word-unit mode control lines; and (2-2) a word line selector for dividing the word line into word units for controlling the conduction of the switch unit and selecting upon data readout the word line of a memory cell with a word having a larger operating margin as a result of a word-unit memory cell comparison.

According to the arrangement above, switching between the 1-bit/1-cell mode and the 1-bit/2-cell mode is allowed on a word unit using the mode control line selector. In addition, the word line of a word-unit memory cell having a larger operating margin can be selected upon data readout, using the word line selector, among the coupled word-unit memory cells used in the 1-bit/2-cell mode.

This is a restriction to the arrangement of the first aspect above which includes two word-paired memory cells. Performing switching between the 1-bit/1-cell mode and the 1-bit/2-cell mode on a word unit using the mode control line selector allows the minimum operating voltage to be reduced by about 24% to about 0.5 V as will be described in an embodiment below.

The present invention also provides a method for determining a memory cell with a word having a larger operating margin as a result of a word-unit memory cell comparison in the semiconductor memory according to the first or second aspect above, the method including the following steps (1a) to (1d):

(1a) identifying a failure site of poor margin in a memory block while reducing an applied voltage by a predetermined threshold voltage for multiple significant words;

(1b) when a word-unit memory cell having a smaller operating margin and causing an unstable operation is identified, applying the 1-bit/n-cell mode (where n is two or more) to the identified word-unit memory cell;

(1c) repeating the steps (1a) and (1b) until the 1-bit/n-cell mode is applied to all the word-unit memory cells; and (1d) when applying the 1-bit/n-cell mode in each word-unit memory cell, determining the other memory cell word-paired with the identified word-unit memory cell as a memory cell with a word having a larger operating margin.

According to the method for determining a word-unit memory cell in a semiconductor memory according to the present invention, the number of word-unit memory cells to which the 1-bit/n-cell mode is applied can be maximized to minimize the impact of process variation and thereby making it possible to achieve a much lower operating voltage.

The present invention further provides a method for determining a memory cell with a word having a larger operating margin as a result of a word-unit memory cell comparison in the semiconductor memory according to the second aspect above, the method including the following steps (2a) to (2d):

(2a) identifying a failure site of poor margin in a memory block while reducing an applied voltage by a predetermined threshold voltage for multiple words in one cache line;

(2b) when a word-unit memory cell having a smaller operating margin and causing an unstable operation is identified, applying the 1-bit/2-cell mode to the identified word-unit memory cell;

(2c) repeating the steps (2a) and (2b) until the 1-bit/2-cell mode is applied to all the word-unit memory cells in the one cache line; and (2d) when applying the 1-bit/2-cell mode in each word-unit memory cell, determining the other memory cell word-paired with the identified word-unit memory cell as a memory cell with a word having a larger operating margin.

According to the method for determining a word-unit memory cell in a semiconductor memory according to the present invention, the number of word-paired memory cells to which the 1-bit/2-cell mode is applied can be maximized to minimize the impact of process variation and thereby making it possible to achieve a much lower operating voltage.

Specifically, in the semiconductor memory according to the first or second aspect of the present invention, the mode control line selector is arranged to apply an output signal from an AND circuit of a signal line for the control line selection signal and a signal line for the global control signal to the divided word-unit mode control lines. The word line selector is arranged to apply an output signal from an AND circuit of a signal line for the word line selection signal and a signal line for the global word signal to the divided word-unit word lines.

According to the arrangement above, word-unit mode switching of memory cells is facilitated and additional circuits can be minimized.

Further, in the semiconductor memory according to the first or second aspect of the present invention, the word line selection signal is preferably fixed to a predetermined level such that using the method for determining a word-unit memory cell in the semiconductor memory described above, a memory cell with a word having a larger operating margin is selected as a result of a word-unit memory cell comparison.

Based on the location map of the memory cell with a word having a larger operating margin obtained through the method for determining a word-unit memory cell in the semiconductor memory described above, the word line selection signal corresponding to the location map is fixed to a predetermined level such that a word-unit memory cell having a larger operating margin is selected upon readout.

Effects of the Invention

According to the semiconductor memory according to the present invention, performing switching between the two operating modes, normal mode and high-reliability mode, at the fine level of a word allows for addressing process variation and switching between two modes is enabled in a word unit, thereby making it possible for the memory to operate at a lower voltage.

BEST MODE FOR CARRYING OUT THE INVENTION

Embodiments of the present invention will be described in detail below with reference to the drawings. The present invention is not limited to the following embodiment and examples of shown in the figure, and the present invention can be variously changed in design.

Embodiment 1

The circuit configuration of a memory according to a first embodiment will be described with reference to FIG. 6, exemplifying the memory array configuration of a cache memory in which 32 bits form one word.

Figure 1:
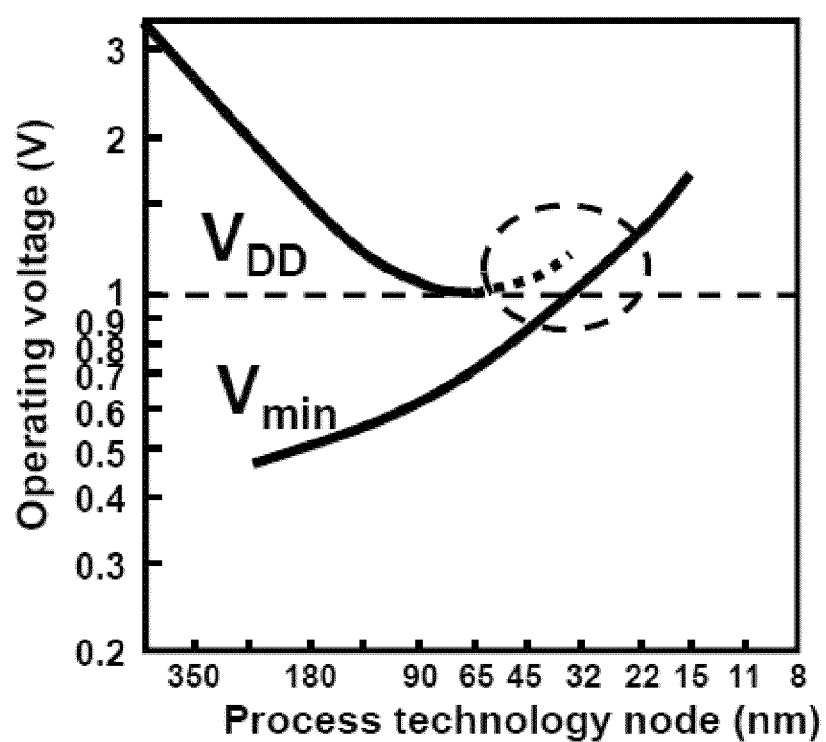
FIG. 1 is a graph relating the process technology node to the operating voltage of CMOS transistors in CMOS transistors.
Figure 2:
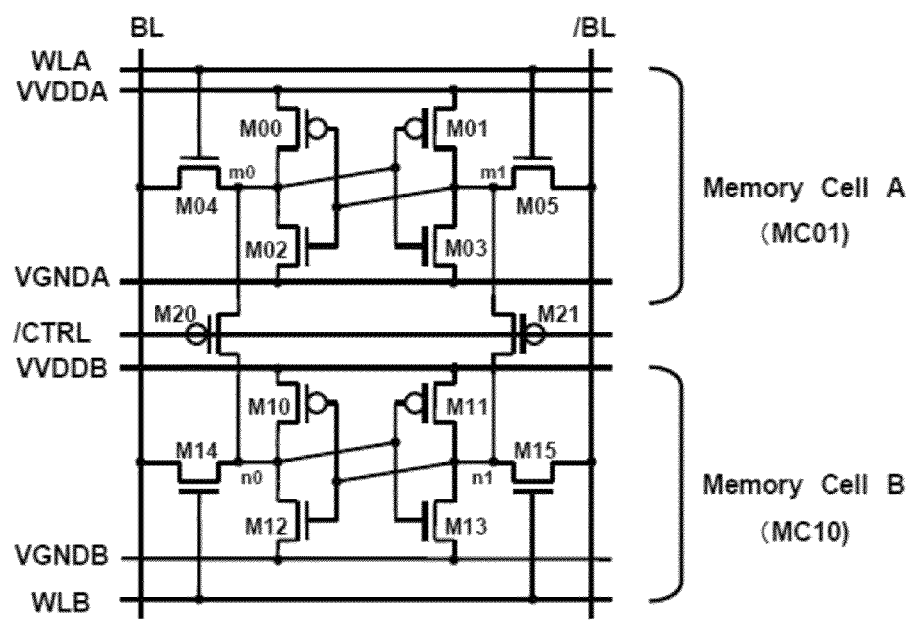
FIG. 2 is a circuit configuration diagram of a proposed memory cell in which the bit reliability of memory cells can be varied dynamically.
Figure 3:
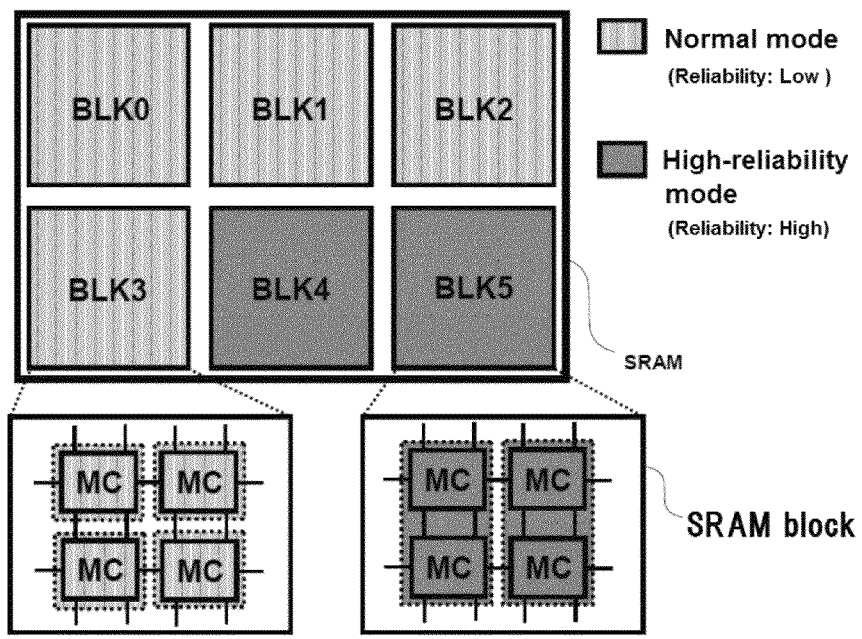
FIG. 3 is a conceptual diagram of memory cell blocks in the proposed semiconductor memory.

As shown in FIG. 2 described above, the memory according to the first embodiment is provided with a pair of P-type MOS transistors (M20 and M21) as mode control switch units and a single mode control line (/CTRL) for controlling the conduction of the P-type MOS transistors between data holding nodes of a pair of 1-bit memory cells (MC01 and MC10) having a 6-transistor configuration, the two memory cells realize two modes, a normal mode and a high-reliability mode.

In the normal mode, one bit is allocated to one memory cell (MC01 or MC10), while in the high-reliability mode, one bit is allocated to a pair of two memory cells (MC01 and MC10). Switching between the two operating modes is performed through the single mode control line (/CTRL) for controlling the conduction of the P-type MOS transistors provided between the pair of memory cells (MC01 and MC10).

Figure 6:
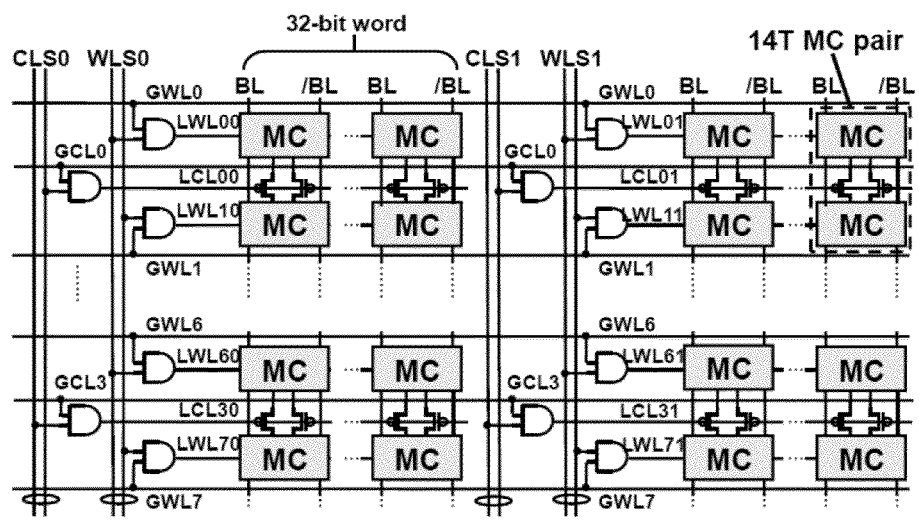
FIG. 6 is a circuit configuration diagram of a memory according to a first embodiment.

FIG. 6 is a circuit configuration diagram showing such memory cell pairs disposed in a matrix. It is noted that the reference symbol MC in FIG. 6 represents a memory cell having a circuit configuration shown in FIG. 2.

In the memory array shown in FIG. 6, 32 memory cells are arranged in rows so that 32 bits form one word (32-bit word). As shown in FIG. 6, the memory array has a circuit configuration in which the mode control line of each memory cell pair is divided into word units (32-bit unit). Specifically, as shown in FIG. 6, the memory array is provided, on a word unit (32-bit unit), with AND circuits as mode control line selectors controlled through signal lines CLS0 and CLS1 (CLS: Control line selection signal) for a control line selection signal and signal lines GCL0, . . . , GCL3 (GCL: Global Control line) for a global control signal. The output signal lines LCL00, LCL01, . . . , LCL30, and LCL31 (LCL: Local Control line) of the AND circuits function as divided word-unit mode control lines.

As shown in FIG. 6, the memory array also has a circuit configuration in which the word line for controlling the conduction of the switch units of each memory cell (MC) is divided into word units. Specifically, as shown in FIG. 6, the memory array is provided, on a word unit (32-bit unit), with AND circuits as word line selectors controlled through signal lines WLS0 and WLS1 (WLS: Word line Selection signal) for a word line selection signal and signal lines GWL0, GWL1, . . . , GWL6, and GWL7 (GWL: Global Word line) for a global word signal. The output signal lines LWL00, LWL01, . . . , LWL70, and LWL71 (LWL: Local Word line) of the AND circuits function as word lines.

FIG. 6 also shows two sets of memory cell pairs (two memory cells form one pair) of a 32-bit word arranged in rows and four stages of memory cell pairs arranged in columns (the second and third stages are omitted in the figure). In the upper left memory cell pair of the 32-bit word (in the first column and the first stage) of FIG. 6, the word lines of the upper and lower memory cells are designated, respectively, by the reference symbols LWL00 and LWL10, and the mode control line is designated by the reference symbol LCL00. In the lower right memory cell pair of 32-bit word (in the second column and the fourth stage) of FIG. 6, the word lines of the upper and lower memory cells are designated, respectively, by the reference symbols LWL61 and LWL71, and the mode control line is designated by the reference symbol LCL31.

In the case of two columns and four stages of word-unit memory cell pairs as shown in FIG. 6 (among the four stages, the second and third stages are omitted in the figure), the required number of the respective lines CLS0 and CLS1 is four. Although the respective lines are indicated by two lines in FIG. 6, there are actually four lines. As the number of stages of memory cell pairs increases, the number of lines CLS0 and CLS1 will also increase. For example, in the case of M×N sets (M stages×N columns) of word-unit memory cell pairs, the required number of the lines CLS is M.

In contrast, the required number of the respective lines WLS0 and WLS1 is two for each word-unit memory cell pair because a reading/writing operation is performed for only one row at a time. The number of the lines WLS remains unchanged even if the number of stages of memory cell pairs of the 32-bit word is increased.

With the above-described circuit configuration, it is possible to perform switching between the 1-bit/1-cell mode and the 1-bit/2-cell mode on a word unit using the mode control line selectors. In addition, the memory cell having a larger operating margin in each memory cell pair is determined in advance on a word unit through a test to be described hereinafter. The signal for the output signal line (LWL) of the word line selector is then turned ON to read data from the memory cell having a larger operating margin.

Figure 7:
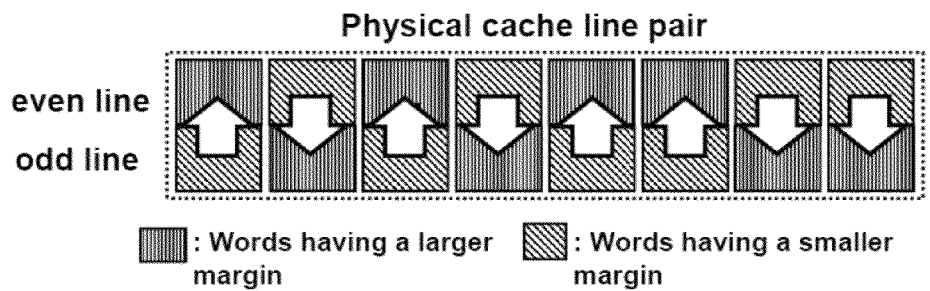
FIG. 7 is a schematic view of a physical cache line pair.

Assuming, for example, a physical cache line pair as shown in FIG. 7 including eight word-unit memory cell pairs, each word-unit memory cell pair having such a memory array circuit configuration as shown in FIG. 6, that is, a memory cell pair of a one word unit is a 32-bit word (32-bit word), it is possible to perform switching between the 1-bit/1-cell mode and the 1-bit/2-cell mode on a word unit using the mode control line selectors.

As shown in FIG. 7, there exist words having a larger operating margin and a smaller operating margin potentially and randomly due to process variation in the physical cache line pair. In such a case, preferentially using the words having a larger operating margin in the 1-bit/1-cell mode can achieve high reliability and stable operation. Hence, the words having a larger operating margin are determined in advance from the physical cache line pair.

A method will hereinafter be described for determining the words having a larger operating margin in the physical cache line pair of FIG. 7.

Figure 8:
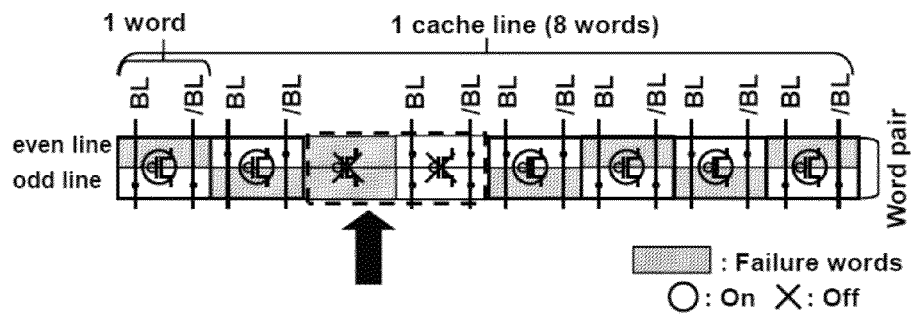
FIG. 8 is a schematic view 1 of a physical cache line pair including an even line and an odd line.

First, FIG. 8 shows a physical cache line pair including an even line and an odd line.

Figure 4:
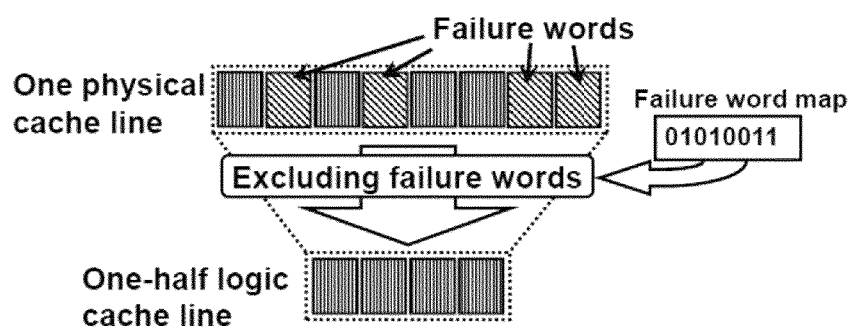
FIG. 4 is an illustrative view (1) of a conventional low-voltage cache memory.
Figure 5:
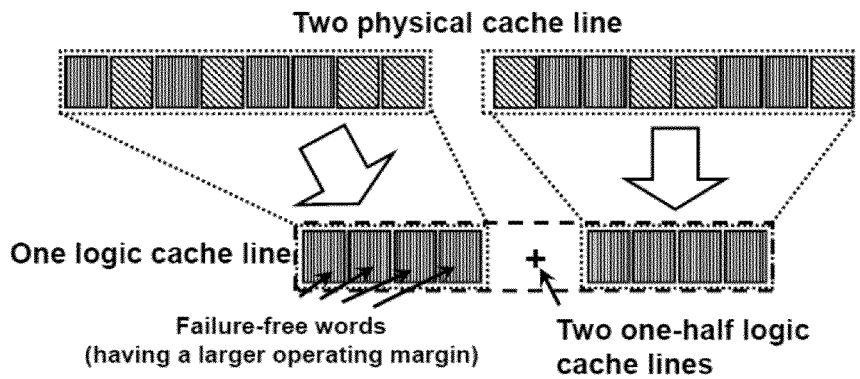
FIG. 5 is an illustrative view (2) of a conventional low-voltage cache memory.

The conventional approach described with reference to FIG. 4 has eliminated factors inhibiting achievement of lower operating voltage of memory cells due to process variation, that is, has a created failure word map and uses memories excluding failure words to achieve lower operating voltage. Assuming now the case of excluding failure words in the cache line pair shown in FIG. 8 using the conventional approach. In the conventional approach, in order to exclude failure words, the applied voltage is reduced gradually to identify words running a poor operation, following which, among the eight words, four words having a smaller operating margin are identified and excluded as failure words.

Applying this conventional approach to the cache line pair shown in FIG. 8 results in that among the total of 16 words, eight words in the odd line and the other eight words in the even line, eight words having a smaller operating margin are to be identified. Since the words having a smaller operating margin exist potentially and randomly due to process variation, failure words can exist as shown in FIG. 8. That is, it is not necessary that either one of the paired words includes a failure word. For example, as indicated by an arrow in FIG. 8, both of the paired words are determined to be failure words like the third one from the left, or both of the paired words are determined not to be failure words like the fourth one from the left.

With the cache line pair shown in FIG. 8 to which the conventional approach is applied, there is thus a possibility that both of the paired words are deemed to be failure words, which makes it impossible to apply the 1-bit/2-cell mode, a high-reliability mode, to all the word pairs.

The inventors have hence invented a method for making it possible to apply the 1-bit/2-cell mode, a high-reliability mode, to all word pairs in such a cache line pair as shown in FIG. 8 to achieve high reliability. Specifically, in the method, a failure site of poor margin in a memory block is first identified while reducing the applied voltage by a predetermined threshold voltage for multiple words in one cache line, following which a word-unit memory cell having a smaller operating margin and causing an unstable operation is identified. The 1-bit/2-cell mode is applied to the identified word pair. Once the processing has been performed, the 1-bit/2-cell mode, a high-reliability mode, can be applied to the word pair.

The above processing is repeated until the 1-bit/2-cell mode is applied to all the word pairs in the one cache line. Then, when applying the 1-bit/2-cell mode in each word-unit memory cell, the other memory cell word-paired with the identified word-unit memory cell is determined as a memory cell with a word having a larger operating margin.

Figure 9:
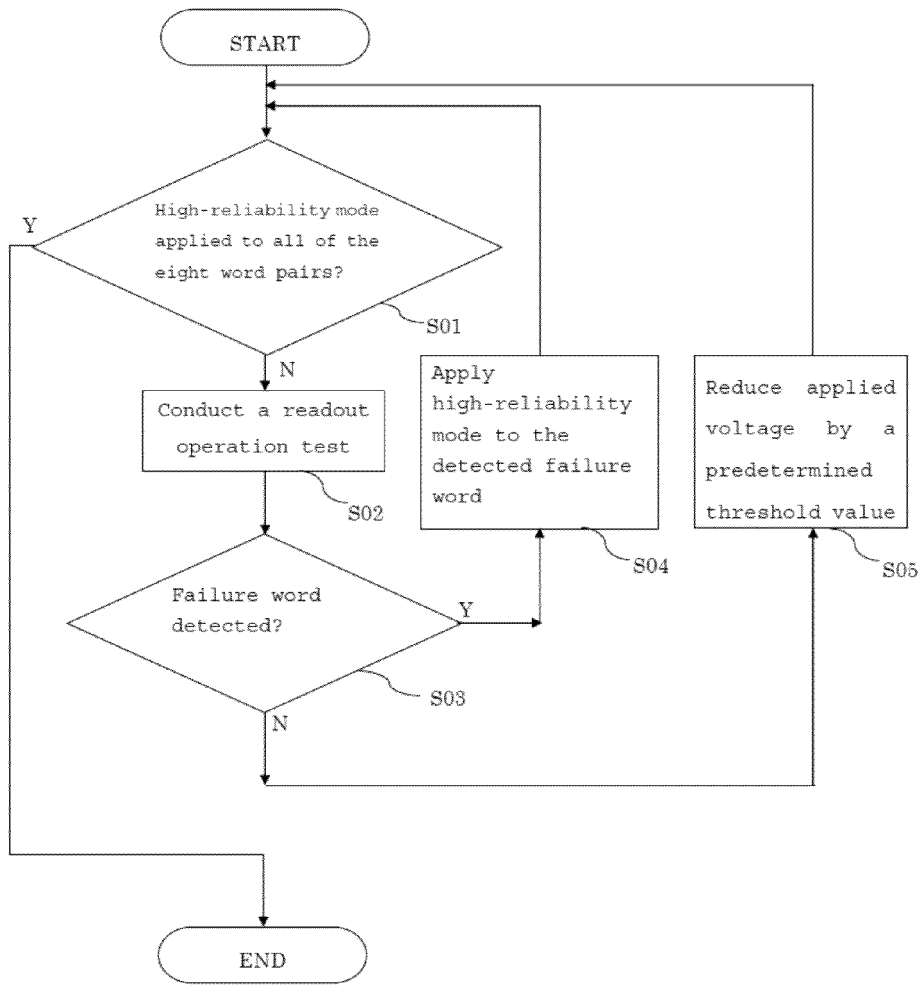
FIG. 9 is a process flow chart for applying a high-reliability mode (1-bit/2-cell mode) to all word pairs.

FIG. 9 shows a process flowchart of a method for applying the 1-bit/2-cell mode, a high-reliability mode, to eight word pairs in a cache line.

In the beginning, the eight word pairs in the cache line are assumed not to be faulty. In a state having a sufficient margin, a readout operation test is conducted with an applied voltage of about 1 V (step S02). In the test, it is determined whether or not a failure word is detected (step S02). If no failure word is detected, the applied voltage is reduced by a predetermined threshold value (e.g. 50 mV) (step S05), and a readout operation test is conducted again (step S02). If a failure word is detected (step S03), the 1-bit/2-cell mode (high-reliability mode) is applied to the detected failure word (step S04).

In the beginning of the repeated processing, it is checked if the 1-bit/2-cell mode (high-reliability mode) has been applied to all of the eight word pairs (step S01). If the mode has been applied to all of the eight word pairs, the processing is terminated; otherwise the above processing is repeated until the mode has been applied to all the pairs.

Figure 10:
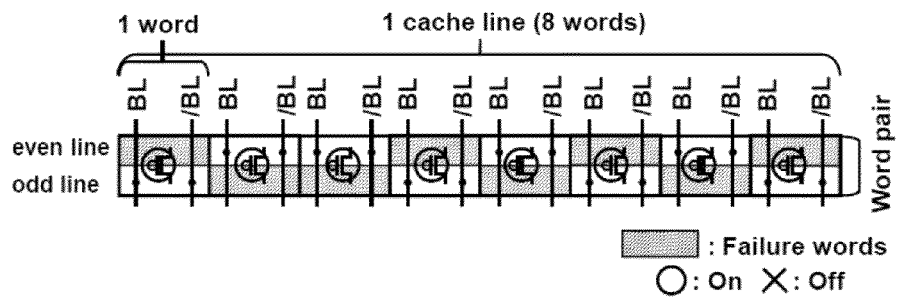
FIG. 10 is a schematic view 2 of a physical cache line pair including an even line and an odd line.

Using the above method results in only one failure word existing in each word pair as in the cache line pair shown in FIG. 10, that is, there is no possibility that both of the paired words are deemed to be failure words at the same time.

Figure 11:
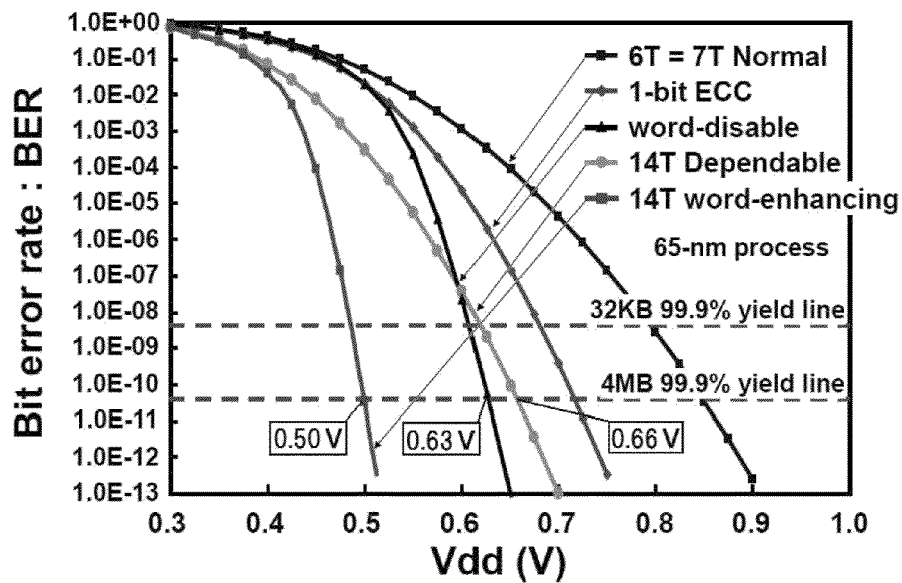
FIG. 11 is a graph showing comparative simulation results of the bit error rate (BER).

FIG. 11 is a graph showing comparative simulation results of the bit error rate (BER) upon readout operation for six types of cache memories: a conventional 6-transistor memory cell (6T); a cache memory using 1-bit ECC (Error Check and Correct); a cache memory using the conventional approach for identifying a failure word described with reference to FIG. 4 (word-disable); the conventionally proposed memory cell that uses the 1-bit/2-cell mode (14T Dependable); and a cache memory using the above-described method for applying the 1-bit/2-cell mode, a high-reliability mode, to all word pairs (14T word-enhancing). This is for the case of 65 nm-process technology node.

It can be confirmed from the graph of FIG. 11 that the cache memory using the method for applying the 1-bit/2-cell mode, a high-reliability mode, to all word pairs (14T word-enhancing) shows a BER of $1.0E^{-10}$ to $1.0E^{-11}$ (99.9% yield line for 4 MB cache memories) even at as low a reduced operating voltage as 0.5 V, having the highest reliability.

Figure 12:
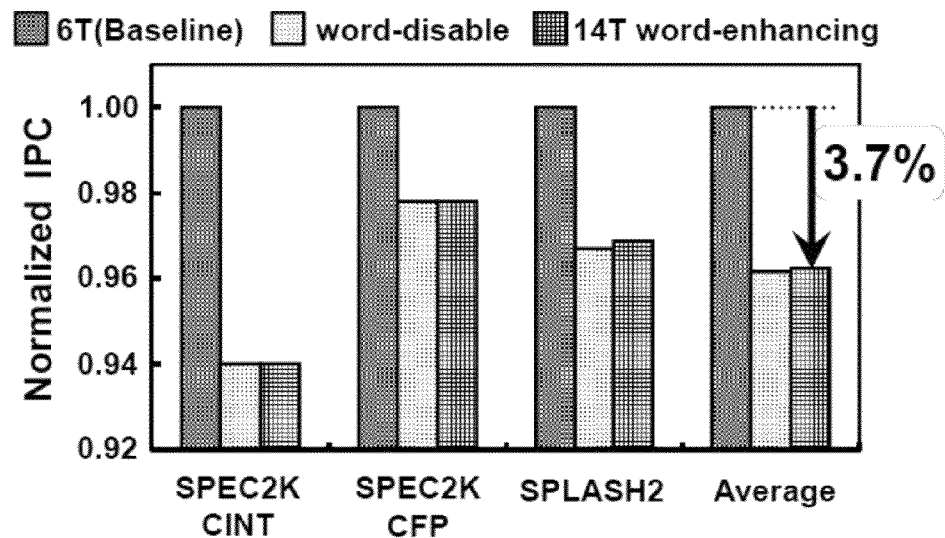
FIG. 12 shows a comparative graph of the performance evaluation.
Figure 13:
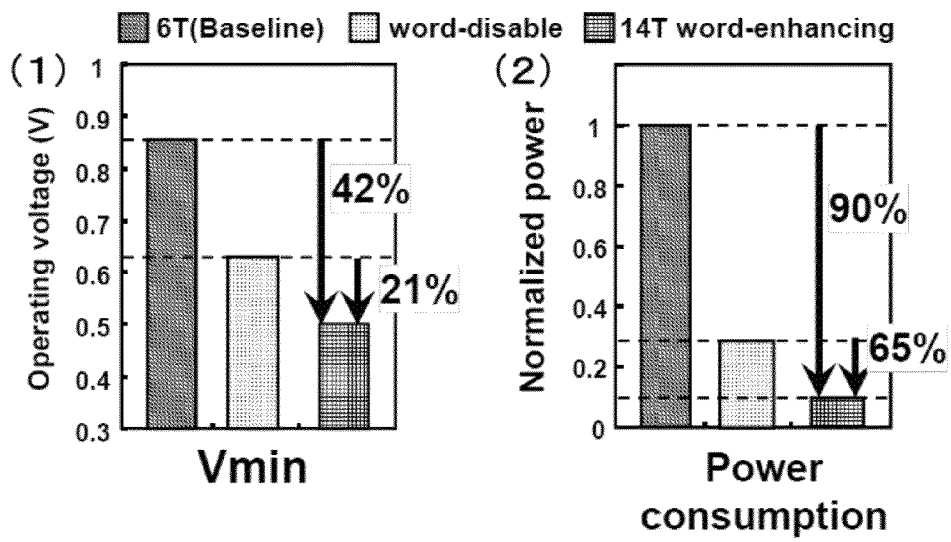
FIG. 13 shows comparative graphs of the operating voltage and the power consumption.

For the three types of cache memories: the conventional 6-transistor memory cell (6T); a cache memory using the conventional approach for identifying a failure word (word-disable); and a cache memory using the method for applying the 1-bit/2-cell mode, a high-reliability mode, to all word pairs (14T word-enhancing), FIG. 12 shows a comparative graph of the performance evaluation and FIGs. 13(1) and 13(2) show comparative graphs of the operating voltage and the dynamic power consumption, respectively.

A SESC [8] simulator was used for the IPC (Instructions Per Cycle) performance evaluation shown in FIG. 12.

A gate delay of 20 F04 was implemented for one pipeline stage and a 65 nm-sized SPICE simulation was used to generate an operating frequency.

Table 1 below shows configuration parameters dependent on the supply voltage Vdd in the three types of cache memories: the conventional 6-transistor memory cell (6T); a cache memory using the conventional approach for identifying a failure word (word-disable); and a cache memory using the method for applying the 1-bit/2-cell mode, a high-reliability mode, to all word pairs (14T word-enhancing).

In addition, Table 2 below shows configuration parameters independent of the supply voltage Vdd.

TABLE 1

|  | High-voltage operation (6T; baseline) | Low-voltage operation w/word-disable | Low-voltage operation w/14T word-enhancing |
|---|---|---|---|
| Vdd (supply voltage) | 1.2 V | 0.63 V | 0.5 V |
| Frequency | 2.6 GHz | 900 MHz | 500 MHz |
| Memory access latency | 260 cycles | 90 cycles | 50 cycles |

TABLE 2

| # of cores | 2 |
|---|---|
| Technology | 65-nm CMOS |
| L1 Instruction cache | 32 KB, 8-way, 2-cycle latency |
| L1 Data cache | 32 KB, 8-way, 2-cycle latency |
| Shared L2 cache | 4 MB, 8-way, 14-cycle latency |
| Cache line size | 64B |
| Fetch/Issue/Retire | 4/4/4 |
| INT/FP registers | 128/128 |

Compared to the conventional 6-transistor memory cell (6T), the cache memories using the conventional approach for identifying a failure word (word-disable) and using the method for applying the 1-bit/2-cell mode, a high-reliability mode, to all word pairs (14T word-enhancing) involve one-cycle penalty for all cache accesses. FIG. 12 shows results and their average values of the IPC performance evaluation using the respective benchmarks SPEC2000 CINT/CFP and SPLASH2.

It is found from FIG. 12 that compared to the conventional 6-transistor memory cell (6T), the cache memories using the conventional approach for identifying a failure word (word-disable) and using the method for applying the 1-bit/2-cell mode, a high-reliability mode, to all word pairs (14T word-enhancing) bring a reduction in the IPC performance by about 3.7 to 3.8%.

"Vmin" in Table 3 below represents the minimum operating voltage obtained for the three types of cache memories at the 99.9% yield line for 4 MB cache memories in the graph of FIG. 11. Also, "power" in Table 3 represents the dynamic power consumption. The dynamic power consumption can be calculated with the following Formula 1, where "Capacitance" is the discharged load capacity of each cache memory, which is a constant value independent of the voltage or frequency. This is therefore ignorable as a coefficient when calculating a relative value such as "Normalized power" in Table 3.

TABLE 3

|  | 6T (Baseline) | Word-disable | 14T word-enhancing |
|---|---|---|---|
| Vmin (mV) | 855 | 630 | 500 |
| Normalized area | 1 | 1.15 | 1.24 |
| Frequency (MHz) | 1700 | 900 | 500 |
| Normalized power | 1 | 0.29 | 0.1 |
| IPC | 1.36 | 1.31 | 1.31 |

(Numerical Formula 1)

$$\text{Dynamic power consumption} = \text{Frequency} \times \text{Capacitance} \times \text{Vmin}^2 \quad \text{(Formula 1)}$$

FIG. 13(1) shows a result of comparing the minimum operating voltage Vmin for the three types of cache memories at the 99.9% yield line for 4 MB cache memories. Compared to the conventional 6-transistor memory cell (6T), the cache memory using the method for applying the 1-bit/2-cell mode, a high-reliability mode (14T word-enhancing), allows a reduction in the minimum operating voltage by 42%. Also, compared to the cache memory using the conventional approach for identifying a failure word (word-disable), the cache memory using the method for applying the 1-bit/2-cell mode, a high-reliability mode (14T word-enhancing), allows a reduction in the minimum operating voltage by 21%.

FIG. 13(2) is a graphical representation of "Normalized power" in Table 3, showing a result of comparing the dynamic power consumption for the three types of cache memories. Compared to the conventional 6-transistor memory cell (6T), the cache memory using the method for applying the 1-bit/2-cell mode, a high-reliability mode (14T word-enhancing), allows a reduction in the dynamic power consumption by 90%. Also, compared to the cache memory using the conventional approach for identifying a failure word (word-disable), the cache memory using the method for applying the 1-bit/2-cell mode, a high-reliability mode (14T word-enhancing), allows a reduction in the dynamic power consumption by 65%.

It can be confirmed from FIGS. 12 and 13 that compared to the conventional 6-transistor memory cell (6T), the cache memory using the method for applying the 1-bit/2-cell mode, a high-reliability mode, to all word pairs (14T word-enhancing) brings a reduction in the IPC performance by 4% or less, but allows the greatest reduction in the operating voltage and the power consumption among the three compared types.

Compared to the normal mode which behaves like the conventional 6-transistor memory cell (6T), the cache memory using the method for applying the 1-bit/2-cell mode, a high-reliability mode (14T word-enhancing), allows an increase in the access time. In particular, during low-voltage operations at, for example, 0.5 V, the number of access cycles increases. Table 4 below shows a result of a comparison of access time data during a dynamic operation for the normal mode and the high-reliability mode at cache sizes of 32 KB and 4 MB and supply voltages Vdd of 1.2 V and 0.5 V.

TABLE 4

| Vdd (supply voltage) | 1.2 V | 0.5 V |
|---|---|---|
| Normal mode (32 KB) | 0.75 ns | 3.89 ns |
| High-reliability mode (32 KB) | 0.95 ns | 4.93 ns |
| Normal mode (4 MB) | 5.20 ns | 27.01 ns |
| High-reliability mode (4 MB) | 5.81 ns | 30.12 ns |

Figure 14:
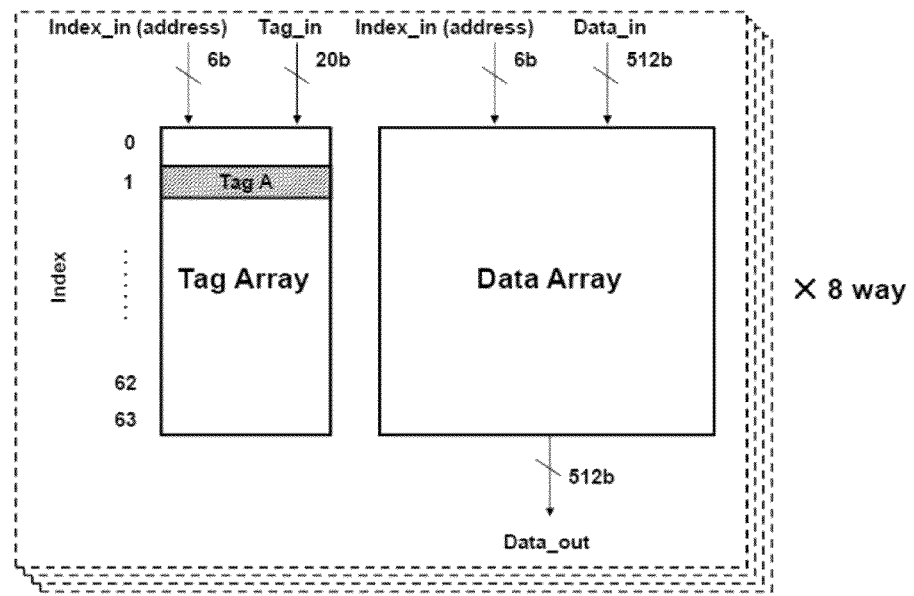
FIG. 14 is a block diagram for 1 way (4 KB), showing the flow of the input address and output data of an L1 cache.
Figure 15:
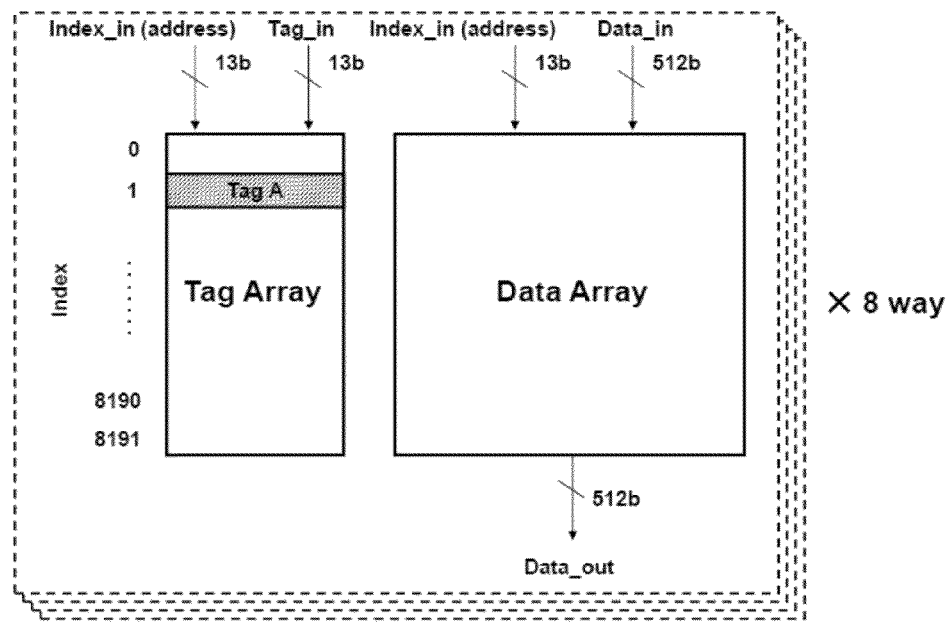
FIG. 15 is a block diagram for 1 way (512 KB), showing the flow of the input address and output data of an L2 cache.

FIG. 14 is a block diagram for 1 way (4 KB), showing the flow of the input address and output data of a 32 KB-L1 cache. In addition, FIG. 15 is a block diagram for 1 way (512 KB), showing the flow of the input address and output data a 4 MB-L2 cache.

Upon readout, the Index (Index_in) corresponding to the address to be read is input to the Tag Array and the Data Array, and the row to be read is determined with Index_in. Similarly, Tag_in corresponding to the address to be read is input to the Tag Array. If the data stored in the row corresponding to Index_in in the Tag Array matches Tag_in, "1" is output as Match_out. At the same time, Data_out is output from the Data Array in correspondence to Index_in.

On the other hand, upon writing, the line to be written in the Tag Array and the Data Array is identified with Index_in, while the data to be written on the line in the Tag Array and the Data Array is identified with the inputs of Tag_in and Data_in.

INDUSTRIAL APPLICABILITY

The present invention is useful for SRAMs used as, for example, cache memories in computers.

DESCRIPTION OF SYMBOLS

MC, MC01, MC10 Memory Cell
CLS Control line selection signal
WLS Word line Selection signal
GCL Global Control line
GWL Global Word line
LCL Local Control line
LWL Local Word line

| [Description of Symbols] | |
|---|---|
| MC, MC01, MC10 | Memory Cell |
| CLS | Control line selection signal |
| WLS | Word line Selection signal |
| GCL | Global Control line |
| GWL | Global Word line |
| LCL | Local Control line |
| LWL | Local Word line |

What is claimed is:

1. A semiconductor memory comprising:
memory cells each including a pair of cross-couple connected inverters with the respective outputs connected to paths leading to a pair of respective bit lines disposed in correspondence to a column of the memory cells, a pair of switch units provided between the bit lines and the outputs of the inverters, and a single word line for controlling the conduction of the switch units; and
a mode control switch unit and a single mode control line for controlling the conduction of the mode control switch unit provided between data holding nodes of adjacent memory cells,
the semiconductor memory providing dynamic switching, using the mode control line, between a mode in which one bit is allocated to one memory cell (1-bit/1-cell mode) and a mode in which one bit is allocated to n (where n is two or more) coupled memory cells (1-bit/n-cell mode),
the semiconductor memory further comprising:
a mode control line selector for dividing the mode control line into word units and selecting among the respective divided word-unit mode control lines; and
a word line selector for dividing the word line into word units for controlling the conduction of the switch unit and selecting upon data readout the word line of a memory cell with a word having a larger operating margin as a result of a word-unit memory cell comparison.

2. A semiconductor memory comprising:
memory cells each including a pair of cross-couple connected inverters with the respective outputs connected to paths leading to a pair of respective bit lines disposed in correspondence to a column of the memory cells, a pair of switch units provided between the bit lines and the outputs of the inverters, and a single word line for controlling the conduction of the switch units; and
a mode control switch unit and a single mode control line for controlling the conduction of the mode control switch unit provided between data holding nodes of adjacent memory cells,
the semiconductor memory providing dynamic switching, using the mode control line, between a mode in which one bit is allocated to one memory cell (1-bit/1-cell mode) and a mode in which one bit is allocated to two coupled memory cells (1-bit/2-cell mode),
the semiconductor memory further comprising:
a mode control line selector for dividing the mode control line into word units and selecting among the respective divided word-unit mode control lines; and
a word line selector for dividing the word line into word units for controlling the conduction of the switch unit and selecting upon data readout the word line of a memory cell with a word having a larger operating margin as a result of a word-unit memory cell comparison.

3. A method for determining a memory cell with a word having a larger operating margin as a result of a word-unit memory cell comparison in a semiconductor memory, the semiconductor memory having memory cells each including a pair of cross-couple connected inverters with the respective outputs connected to paths leading to a pair of respective bit lines disposed in correspondence to a column of the memory cells, a pair of switch units provided between the bit lines and the outputs of the inverters, and a single word line for controlling the conduction of the switch units, and a mode control switch unit and a single mode control line for controlling the conduction of the mode control switch unit provided between data holding nodes of adjacent memory cells, the semiconductor memory providing dynamic switching, using the mode control line, between a mode in which one bit is allocated to one memory cell (1-bit/1-cell mode) and a mode in which one bit is allocated to n (where n is two or more) coupled memory cells (1-bit/n-cell mode), the semiconductor memory further having a mode control line selector for dividing the mode control line into word units and selecting among the respective divided word-unit mode control lines, and a word line selector for dividing the word line into word units for controlling the conduction of the switch unit and selecting upon data readout the word line of a memory cell with a word having a larger operating margin as a result of a word-unit memory cell comparison, the method comprising the steps of:

(a) identifying a failure site of poor margin in a memory block while reducing an applied voltage by a predetermined threshold voltage for a plurality of significant words;

(b) when a word-unit memory cell having a smaller operating margin and causing an unstable operation is identified, applying the 1-bit/n-cell mode (where n is two or more) to the identified word-unit memory cell;

(c) repeating the steps (a) and (b) until the 1-bit/n-cell mode is applied to all the word-unit memory cells; and (d) when applying the 1-bit/n-cell mode in each word-unit memory cell, determining the other memory cell word-paired with the identified word-unit memory cell as a memory cell with a word having a larger operating margin.

4. A method for determining a memory cell with a word having a larger operating margin as a result of a word-unit memory cell comparison in a semiconductor memory, the semiconductor memory having memory cells each including a pair of cross-couple connected inverters with the respective outputs connected to paths leading to a pair of respective bit lines disposed in correspondence to a column of the memory cells, a pair of switch units provided between the bit lines and the outputs of the inverters, and a single word line for controlling the conduction of the switch units, and a mode control switch unit and a single mode control line for controlling the conduction of the mode control switch unit provided between data holding nodes of adjacent memory cells, the semiconductor memory providing dynamic switching, using the mode control line, between a mode in which one bit is allocated to one memory cell (1-bit/1-cell mode) and a mode in which one bit is allocated to two coupled memory cells (1-bit/2-cell mode), the semiconductor memory further having a mode control line selector for dividing the mode control line into word units and selecting among the respective divided word-unit mode control lines, and a word line selector for dividing the word line into word units for controlling the conduction of the switch unit and selecting upon data readout the word line of a memory cell with a word having a larger operating margin as a result of a word-unit memory cell comparison, the method comprising the steps of:

(a) identifying a failure site of poor margin in a memory block while reducing an applied voltage by a predetermined threshold voltage for a plurality of words in one cache line;

(b) when a word-unit memory cell having a smaller operating margin and causing an unstable operation is identified, applying the 1-bit/2-cell mode to the identified word-unit memory cell;

(c) repeating the steps (a) and (b) until the 1-bit/2-cell mode is applied to all the word-unit memory cells in the one cache line; and (d) when applying the 1-bit/2-cell mode in each word-unit memory cell, determining the other memory cell word-paired with the identified word-unit memory cell as a memory cell with a word having a larger operating margin.

5. The semiconductor memory according to claim 1, wherein the mode control line selector is controlled by a control line selection signal selectable in a matrix on a word unit and a global control signal.

6. The semiconductor memory according to claim 5, wherein the mode control line selector is arranged to apply an output signal from an AND circuit of a signal line for the control line selection signal and a signal line for the global control signal to the word-unit divided mode control lines.

7. The semiconductor memory according to claim 1, wherein the word line selector is controlled by a word line selection signal selectable in a matrix on a word unit and a global word signal.

8. The semiconductor memory according to claim 7, wherein the word line selector is arranged to apply an output signal from an AND circuit of a signal line for the word line selection signal and a signal line for the global word signal to the word-unit divided word lines.

9. The method according to claim 3, wherein the word line selection signal is fixed to a predetermined level such that using the method for determining a word-unit memory cell in a semiconductor memory, a memory cell with a word having a larger operating margin is selected as a result of a word-unit memory cell comparison.

10. The method according to claim 4, wherein the word line selection signal is fixed to a predetermined level such that using the method for determining a word-unit memory cell in a semiconductor memory, a memory cell with a word having a larger operating margin is selected as a result of a word-unit memory cell comparison.

11. The semiconductor memory according to claim 2, wherein the mode control line selector is controlled by a control line selection signal selectable in a matrix on a word unit and a global control signal.

12. The semiconductor memory according to claim 11, wherein the mode control line selector is arranged to apply an output signal from an AND circuit of a signal line for the control line selection signal and a signal line for the global control signal to the word-unit divided mode control lines.

13. The semiconductor memory according to claim 2, wherein the word line selector is controlled by a word line selection signal selectable in a matrix on a word unit and a global word signal.

14. The semiconductor memory according to claim 13, wherein the word line selector is arranged to apply an output signal from an AND circuit of a signal line for the word line selection signal and a signal line for the global word signal to the word-unit divided word lines.

15. The semiconductor memory according to claim 3, wherein the word line selection signal is fixed to a predetermined level such that using the method for determining a word-unit memory cell in a semiconductor memory, a memory cell with a word having a larger operating margin is selected as a result of a word-unit memory cell comparison.

* * * * *